(12) United States Patent
Nakayama et al.

(10) Patent No.: US 8,279,663 B2
(45) Date of Patent: *Oct. 2, 2012

(54) MAGNETORESISTANCE EFFECT ELEMENT AND MAGNETIC RANDOM ACCESS MEMORY

(75) Inventors: Masahiko Nakayama, Yokohama (JP); Tadashi Kai, Tokyo (JP); Sumio Ikegawa, Tokyo (JP); Hiroaki Yoda, Sagamihara (JP); Tatsuya Kishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/184,976

(22) Filed: Jul. 18, 2011

(65) Prior Publication Data

US 2011/0309418 A1    Dec. 22, 2011

Related U.S. Application Data

(63) Continuation of application No. 12/396,778, filed on Mar. 3, 2009, now Pat. No. 8,014,193.

(30) Foreign Application Priority Data

Mar. 25, 2008    (JP) ................................. 2008-078420

(51) Int. Cl.
    *G11C 11/00* (2006.01)
(52) U.S. Cl. ......................... 365/158; 365/171; 365/173
(58) Field of Classification Search .................. 365/158, 365/171, 173, 178
    See application file for complete search history.

(56) References Cited

U.S. PATENT DOCUMENTS

| | | | |
|---|---|---|---|
| 6,256,223 B1 | 7/2001 | Sun | |
| 8,014,193 B2 * | 9/2011 | Nakayama et al. | ........... 365/158 |
| 2005/0079665 A1 | 4/2005 | Sato et al. | |
| 2009/0015958 A1 | 1/2009 | Nakamura et al. | |
| 2009/0296283 A1 | 12/2009 | Mizuno et al. | |

FOREIGN PATENT DOCUMENTS

| | | |
|---|---|---|
| CN | 101093721 A | 12/2007 |
| JP | 2002-261352 | 9/2002 |
| JP | 2008-28362 | 2/2008 |
| JP | 2008-64499 | 3/2008 |

OTHER PUBLICATIONS

U.S. Appl. No. 13/227,959, filed Sep. 8, 2011, Saida, et al.

* cited by examiner

*Primary Examiner* — Richard Elms
*Assistant Examiner* — Hien Nguyen
(74) *Attorney, Agent, or Firm* — Oblon, Spivak, McClelland, Maier & Neustadt, L.L.P.

(57) ABSTRACT

A magnetoresistance effect element includes: a first ferromagnetic layer having invariable magnetization perpendicular to a film plane; a second ferromagnetic layer having variable magnetization perpendicular to the film plane; a first nonmagnetic layer interposed between the first ferromagnetic layer and the second ferromagnetic layer; a third ferromagnetic layer provided on an opposite side of the second ferromagnetic layer from the first nonmagnetic layer, and having variable magnetization parallel to the film plane; and a second nonmagnetic layer interposed between the second and third ferromagnetic layers. Spin-polarized electrons are injected into the second ferromagnetic layer by flowing a current in the direction perpendicular to the film planes between the first and third ferromagnetic layers, precession movement is induced in the magnetization of the third ferromagnetic layer by injecting the spin-polarized electrons, and a microwave magnetic field of a frequency corresponding to the precession movement is applied to the second ferromagnetic layer.

12 Claims, 10 Drawing Sheets

MAGNETORESISTANCE EFFECT ELEMENT AND MAGNETIC RANDOM ACCESS MEMORY

CROSS-REFERENCE TO RELATED APPLICATION

This application is a continuation of U.S. application Ser. No. 12/396,778 filed Mar. 3, 2009, and is based upon and claims the benefit of priority from prior Japanese Patent Application No. 2008-78420 filed on Mar. 25, 2008 in Japan, the entire contents of each of which are incorporated herein by reference.

BACKGROUND OF THE INVENTION

1. Field of the Invention

The present invention relates to a magnetoresistance effect element and a magnetic random access memory.

2. Related Art

Various types of solid magnetic memories have been developed. In recent years, magnetic random access memories (MRAM) including magnetoresistance effect elements each exhibiting the giant magnetoresistive (GMR) effect have been suggested, and, particularly, attention is drawn to magnetic random access memories using ferromagnetic tunnel junctions each exhibiting the tunnel magnetoresistive (TMR) effect.

A MTJ (Magnetic Tunnel Junction) element of a ferromagnetic tunnel junction is formed with a three-layer film including a first ferromagnetic layer, an insulating layer, and a second ferromagnetic layer. At the time of reading, a current flows, tunneling through the insulating layer. The junction resistance value at this point varies depending on the cosine of the relative angle between the magnetization of the first ferromagnetic layer and the magnetization of the second ferromagnetic layer. Accordingly, the junction resistance value becomes smallest when the magnetization directions of the first and second ferromagnetic layers are parallel to each other (the same direction), but becomes largest when the magnetization directions of the first and second ferromagnetic layers are antiparallel to each other (opposite from each other). This is called the TMR effect. The variation in resistance value due to the TMR effect sometimes becomes greater than 300% at room temperature.

In a magnetic memory device that includes MTJ elements of ferromagnetic tunnel junctions as memory cells, at least one of the ferromagnetic layers in each memory cell is regarded as the reference layer, and the magnetization direction of the ferromagnetic layer is fixed, while the other ferromagnetic layer is set as the recording layer. In such a cell, information is recorded by associating binary information of "0" and "1" with the parallel magnetization arrangement and antiparallel magnetization arrangement between the reference layer and the recording layer. Conventionally, writing of recording information is performed on such cells according to a technique by which the magnetization of the recording layer is reversed with a magnetic field generated by applying a current to the write wire provided separately from the cell (the technique will be hereinafter referred to as the current field write technique). By the current field write technique, however, the current amount required for writing becomes greater as the memory cells become smaller. As a result, it becomes difficult to achieve large memory capacity. In recent years, a technique for replacing the current field write technique has been suggested (see U.S. Pat. No. 6,256,223, for example). By the technique, the magnetization of the recording layer is reversed with spin torque injected from the reference layer by application of a current directly to each MTJ element (the technique will be hereinafter referred to as the spin torque write technique). By the spin torque write technique, the current amount required for writing characteristically becomes smaller as the memory cells become smaller in size, and large memory capacity can be easily achieved. Reading information from a memory cell is performed by applying a current to the ferromagnetic tunnel junction and detecting the resistance variation caused by the TMR effect. Such memory cells are arranged in large number, so as to form a magnetic memory. An actual structure is formed by arranging switching transistors for the respective cells, as in a DRAM, for example, so that a desired cell can be selected, and then incorporating a peripheral circuit into the structure.

To realize large-capacity memory, it is necessary to increase the cell occupancy in the chip by making the MTJ elements smaller in size, and to reduce the current amount necessary for writing. For example, to realize large-capacity memory of several gigabits or larger, the write current density should be smaller than 1 MA/cm$^2$. As mentioned above, the spin torque write technique is advantageous in realizing large-capacity memory. However, the current density required for writing is reportedly in the neighborhood of 3 MA/cm$^2$, and the decrease in write current amount is not sufficient.

SUMMARY OF THE INVENTION

The present invention has been made in view of these circumstances, and an object thereof is to provide a magnetoresistance effect element and a magnetic random access memory that can minimize the current required for writing, perform high-speed writing, and have large capacity.

A magnetoresistance effect element according to a first aspect of the present invention includes: a first ferromagnetic layer having invariable magnetization perpendicular to a film plane; a second ferromagnetic layer having variable magnetization perpendicular to the film plane; a first nonmagnetic layer interposed between the first ferromagnetic layer and the second ferromagnetic layer; a third ferromagnetic layer provided on an opposite side of the second ferromagnetic layer from the first nonmagnetic layer, and having variable magnetization parallel to the film plane; and a second nonmagnetic layer interposed between the second ferromagnetic layer and the third ferromagnetic layer, spin-polarized electrons being injected into the second ferromagnetic layer by flowing a current in the direction perpendicular to the film planes between the first ferromagnetic layer and the third ferromagnetic layer, precession movement being induced in the magnetization of the third ferromagnetic layer by injecting the spin-polarized electrons into the third ferromagnetic layer from the second ferromagnetic layer through the second nonmagnetic layer, a microwave magnetic field of a frequency corresponding to the precession movement being applied to the second ferromagnetic layer.

A magnetic random access memory according to a second aspect of the present invention includes: the magnetoresistance effect element according to the first aspect; a first wire that is electrically connected to the first ferromagnetic layer; and a second wire that is electrically connected to the third ferromagnetic layer.

DETAILED DESCRIPTION OF THE INVENTION

The following is a description of embodiments of the present invention, with reference to the accompanying drawings.

(First Embodiment)

Figure 1:
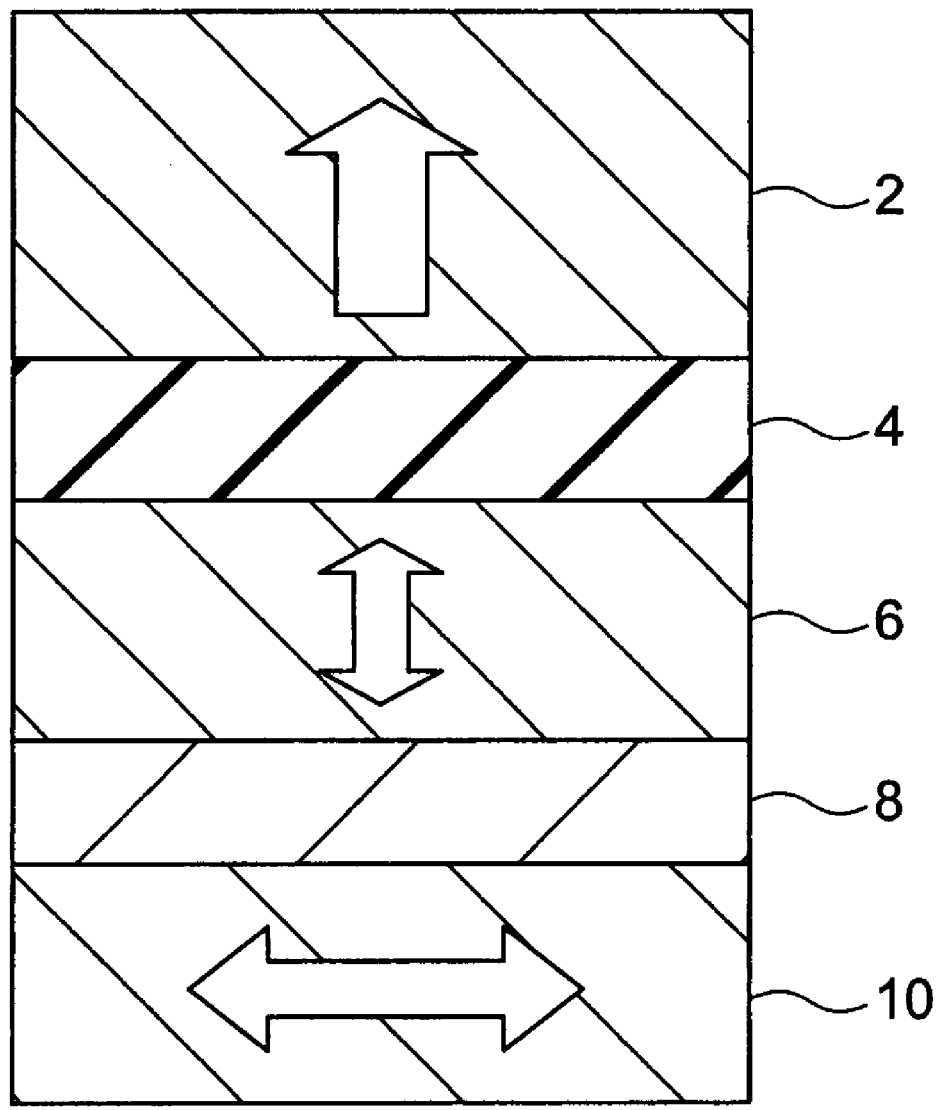
FIG. 1 is a cross-sectional view of a magnetoresistance effect element in accordance with a first embodiment of the present invention.

FIG. 1 shows a magnetoresistance effect element in accordance with a first embodiment 1 of the present invention. The magnetoresistance effect element of this embodiment includes an invariable magnetization layer (reference magnetization layer) 2, a tunnel barrier layer 4, a magnetic recording layer 6, a spacer layer 8, and a magnetization oscillating layer 10. The invariable magnetization layer 2 includes a ferromagnetic layer having a magnetization direction that is substantially perpendicular to the film plane and is invariable before and after application of a current to the magnetoresistance effect element 1. The tunnel barrier layer 4 is formed with an oxide containing an element selected from the group of Mg, Al, Ti, Hf, and the likes, from which a desired magnetoresistance effect variation can be obtained by tunneling electrons. More specifically, magnesium oxide, aluminum oxide, or the like can be used as the tunnel barrier layer 4. The magnetic recording layer 6 includes a ferromagnetic layer having a magnetization direction that is substantially perpendicular to the film plane and can be varied before and after application of a current to the magnetoresistance effect element 1. The spacer layer 8 includes a nonmagnetic layer. The magnetization oscillating layer 10 includes a ferromagnetic layer having a magnetization direction that is substantially parallel to the film plane and is variable.

In the magnetoresistive effect element of this embodiment, the magnetic recording layer 6 should be formed with a magnetic material having sufficiently large perpendicular magnetic anisotropy. Therefore, the optimum magnetic material for the magnetic recording layer 6 should be an ordered alloy that contains one or more elements selected from the group of Fe, Co, and Ni, and one or more elements selected from the group of Pt and Pd, and has a L10 crystalline structure. For example, FePd, CoPt, or the like can be used for the magnetic recording layer 6. Alternatively, the magnetic recording layer 6 may be formed with an alloy that contains one or more elements selected from the group of Fe, Co, and Ni, and one or more elements selected from the group of Cr, Pt, Pd, and Ta, and has a hexagonal crystalline structure. For example, it is possible to use a Co—Cr alloy ("—" indicating that the subject material is an alloy), or Co—Cr—Pt, Co—Cr—Pd, Co—Cr—Ta, or the like, which is formed by adding Pt, Pd, Ta, or the like to a Co—Cr alloy. Instead of Co or in addition to Co, Fe or Ni may be used.

Figure 2:
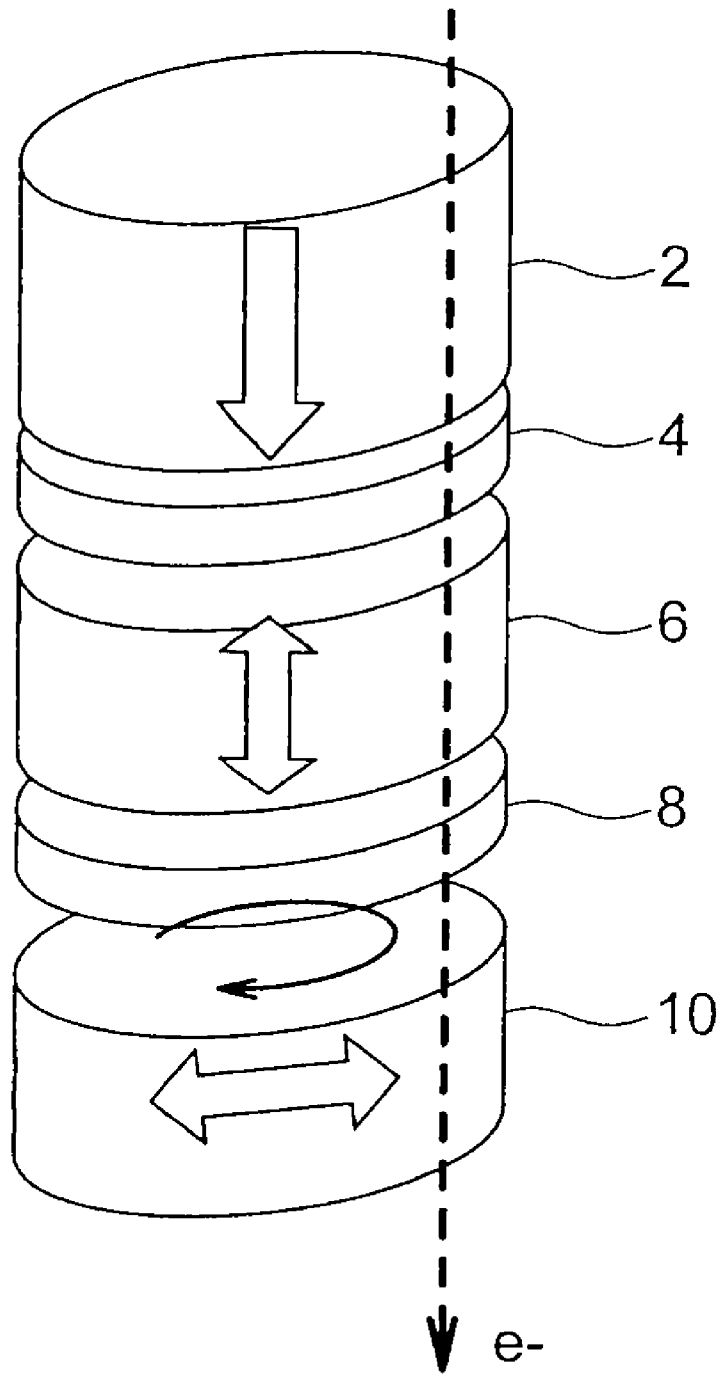
FIG. 2 is a perspective view for explaining the operation of the magnetoresistance effect element in accordance with the first embodiment.

Referring now to FIG. 2, the operation of the magnetoresistance effect element 1 of this embodiment is described. When a current is applied to the magnetoresistance effect element 1 of this embodiment, spin-polarized electrons flow from the invariable magnetization layer 2 into the magnetic recording layer 6 through the tunnel barrier layer 4, and the magnetization state of the magnetic recording layer 6 is determined (spin injection writing). For example, in a case where the magnetization direction of the invariable magnetization layer 2 is antiparallel to the magnetization direction of the magnetic recording layer 6, electrons flow from the invariable magnetization layer 2 to the magnetization oscillating layer 10, so as to reverse the magnetization of the magnetic recording layer 6. The electrons polarized in the magnetization direction of the invariable magnetization layer 2 then flow from the invariable magnetization layer 2 into the magnetic recording layer 6 and the magnetization oscillating layer 10. In a case where the magnetization direction of the invariable magnetization layer 2 is parallel to the magnetization direction of the magnetic recording layer 6, electrons flow from the magnetization oscillating layer 10 to the invariable magnetization layer 2, so as to reverse the magnetization of the magnetic recording layer 6. The electrons having spins polarized in the same direction as the magnetization direction of the invariable magnetization layer 2 then pass through the invariable magnetization layer 2, but the electrons having spins polarized in a different direction are reflected by the invariable magnetization layer 2 and flow into the magnetic recording layer 6 and the magnetization oscillating layer 10. In either way, the electrons spin-polarized in a direction perpendicular to the film plane simultaneously flow from the magnetic recording layer 6 into the magnetization oscillating layer 10 through the spacer layer 8. When a current spin-polarized in a direction perpendicular to magnetization parallel to the film plane is caused to flow in the magnetization oscillating layer 10, the magnetization parallel to the film plane has a precession movement in the film plane at a natural frequency of the GHz order, or rotates. A magnetic field in a direction parallel to the film plane is constantly applied to the magnetic recording layer 6 from the magnetization parallel to the film plane of the magnetization oscillating layer 10. Accordingly, in a case where the magnetization parallel to the film plane of the magnetization oscillating layer 10 is rotated by the spin injection from the magnetic recording layer 6, a microwave magnetic field that rotates in the in-plane direction at a frequency of the GHz order is induced in the magnetic recording layer 6. Here, the microwave magnetic field might be a magnetic field having a frequency in the range of 300 MHz to 3 THz.

In general, a magnetic material has a natural resonant frequency that resonates with a microwave magnetic field, depending on anisotropy energy or saturation magnetization. When a microwave magnetic field corresponding to the resonant frequency is induced in a direction parallel to the film plane with respect to perpendicular magnetization, a resonance phenomenon is caused, and the magnetization perpendicular to the film plane rapidly tilts toward a direction parallel to the film plane, to start precession movement. Here, the perpendicular magnetic anisotropy of the magnetization perpendicular to the film plane effectively becomes much smaller than the original magnetic anisotropy due to the influence of the microwave magnetic field. As a microwave magnetic field is induced at the same time as when spin injection writing is performed in the magnetoresistance effect element in the above manner, the spin injection writing becomes easier, and the current value required for a reversal can be made sufficiently small. The frequency of the precession movement induced in the magnetic recording layer when the magnetization of the magnetic recording layer is reversed is determined by the following equation:

$$f = -2\gamma \left( 4\pi M_s - \frac{2K_u}{M_s} \right)$$

Figure 3:
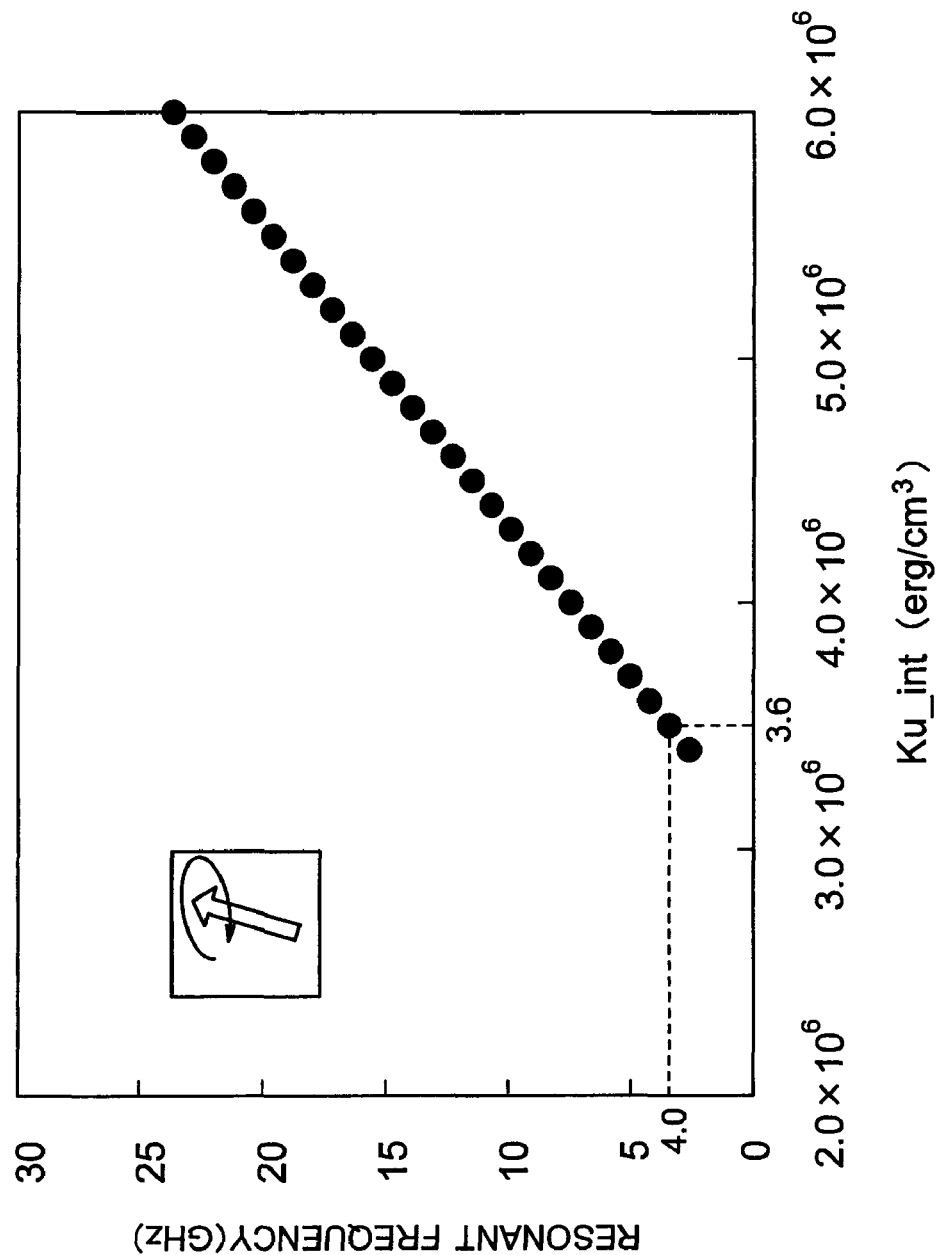
FIG. 3 shows the relationship between the resonant frequency and the magnetic anisotropic constant in the magnetic recording layer.
Figure 4A:
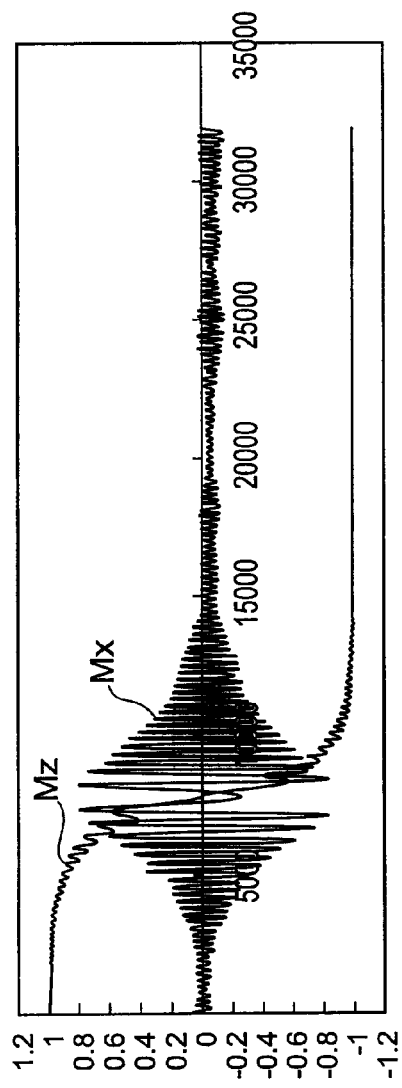
FIGS. 4A and 4B show the magnetization dependence of magnetization components observed in a case where spin injection writing is performed on the magnetic recording layer.
Figure 4B:
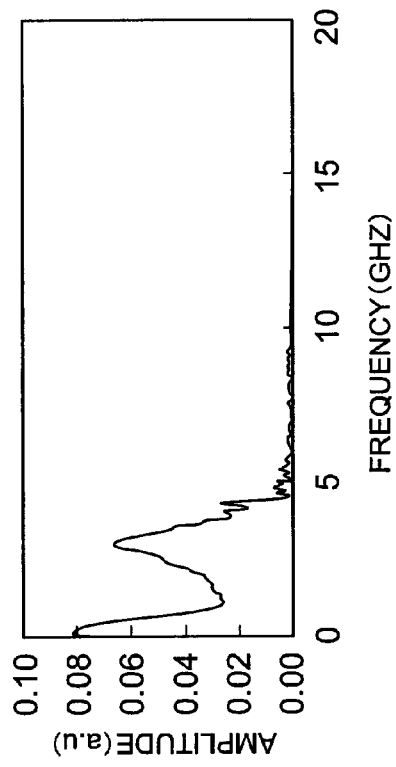

Here, $\gamma$ represents the gyromagnetic constant ($\gamma = 1.76 \times 10^7$ Hz/Oe), $M_s$ represents the saturation magnetization, and $K_u$ represents the magnetic anisotropy constant. The above equation is equivalent to the resonance conditions for general ferromagnetic resonance. FIG. 3 shows the results of calculations performed according to the above equation to determine the dependence of the resonant frequency on $K_u$ in a magnetic recording layer having $M_s$ of 700 emu/cm$^3$. As can be seen from FIG. 3, where a material having $M_s$ of 700 emu/cm$^3$ and $K_u$ of 3.6 Merg/cm$^3$ is used as the magnetic recording layer, the magnetic recording layer has a magnetic resonance frequency of 4.1 GHz. FIG. 4A shows the time dependence of the component Mz of the magnetization in a direction perpendicular to the film plane and the component Mx of the magnetization in a direction parallel to the film plane, where spin injection writing is performed on a magnetic recording layer that has magnetization in the direction perpendicular to the film plane and has $M_s$ of 700 emu/cm$^3$ and $K_u$ of 3.6 Merg/cm$^3$ calculated through a micromagnetic simulation. As can be seen from FIG. 4A, there is an obvious oscillation phenomenon in the component Mx in the direction parallel to the film plane. FIG. 4B shows the results of a frequency analysis carried out on the time dependence of the component Mx in the direction parallel to the film plane. As can be seen from FIG. 4B, the natural frequency of the in-plane direction precession movement induced by spin injection writing in the magnetic recording layer 6 of this embodiment is approximately 4 GHz, which matches the result of an analysis calculation performed through a micromagnetic simulation. Based on the above results, it can be predicted that the spin injection reversal current can be made smaller by inducing a microwave magnetic field having a frequency of approximately 4 GHz in the magnetic recording layer 6 having $M_s$ of 700 emu/cm$^3$ and $K_u$ of 3.6 Merg/cm$^3$.

In this embodiment, the magnetization oscillating layer 10 that has magnetization oscillating when a write current is applied and spin injection is performed from the magnetic recording layer 6, and has a variable magnetization direction parallel to the film plane is used as the source of microwave magnetic fields. The conditions for oscillation in a case where spin injection is performed onto the magnetization oscillating layer 10 from the magnetic recording layer 6 are now described. The oscillating frequency $f_i$ caused when spin injection is performed onto the magnetization oscillating layer 10 from the magnetic recording layer 6 is expressed by the following equation obtained through a LLG (Landau-Lifshitz-Gilbert) equation:

$$f_i = \frac{\gamma}{2\pi\alpha} \left( \frac{\hbar}{2e} \right) \frac{g(\theta)}{M_s t} J$$

provided, $$g(\theta) = \frac{1}{2} \frac{P}{1 + P^2 \cos\theta}$$

Here, $\gamma$ represents the gyromagnetic constant, $\alpha$ represents the damping constant, P represents the polarization, $M_s$ represents the saturation magnetization, t represents the film thickness of the magnetization oscillating layer 10, J represents the current density in the magnetization oscillating layer 10, h bar represents the Dirac constant obtained by dividing the Planck's constant by $2\pi$, e represents the elementary charge, and $\theta$ represents the relative angle of the magnetization of the magnetization oscillating layer 10 with respect to the magnetization of the magnetic recording layer 6 under the oscillation conditions.

Figure 5:
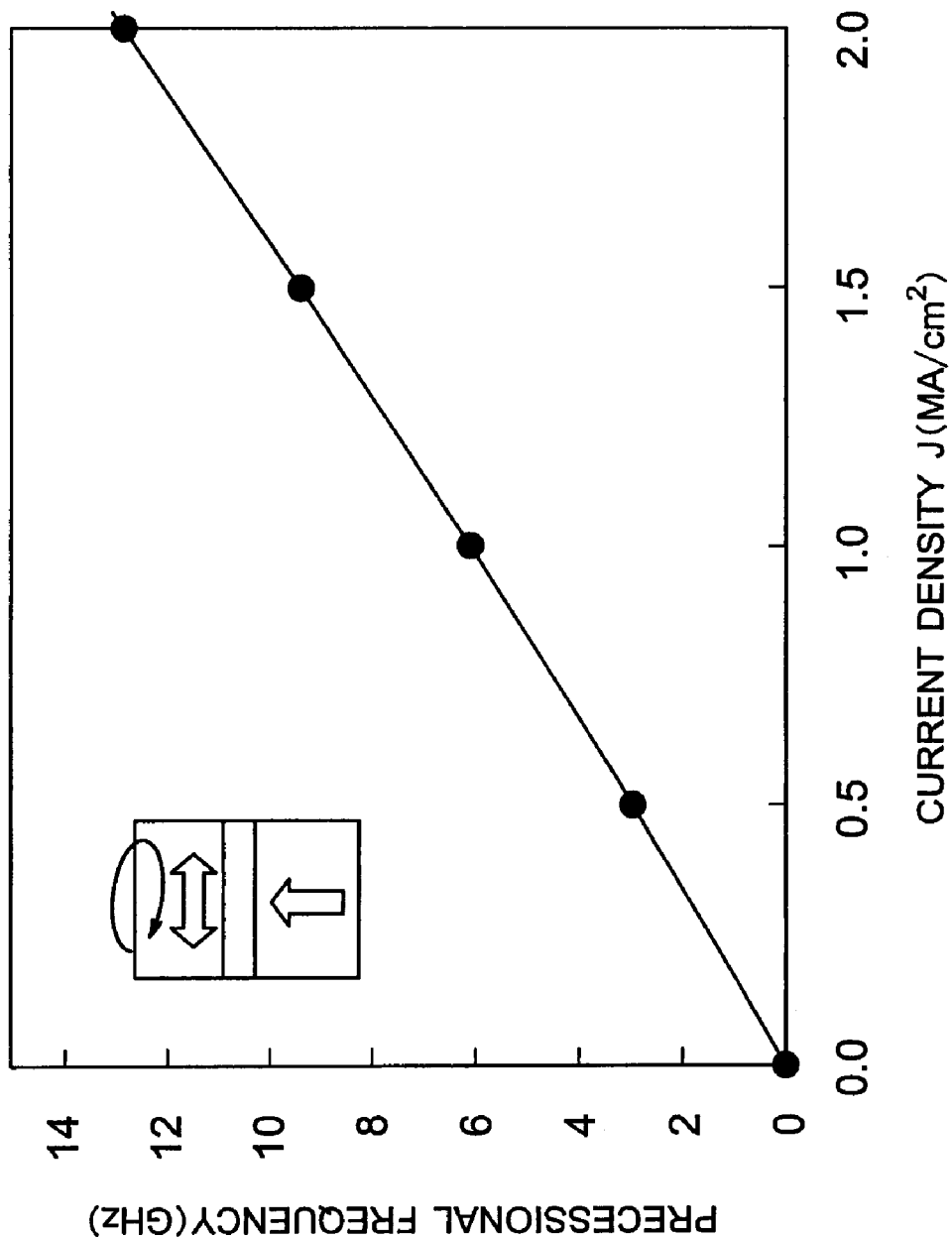
FIG. 5 shows the relationship between the current density and the frequency of precession movement.

A stacked film that includes a ferromagnetic layer having magnetization perpendicular to the film plane, a nonmagnetic layer, and a magnetization oscillating layer having magnetization parallel to the film plane is prepared, and spin-polarized electrons are caused to flow into the magnetization oscillating layer from the ferromagnetic layer through the nonmagnetic layer. FIG. 5 shows the current density dependence of the oscillating frequency of the magnetization oscillating layer having the magnetization parallel to the film plane. Here, the magnetization oscillating layer is made of a material having magnetic characteristics that are represented by $M_s$ of 700 emu/cm$^3$, $\alpha$ of 0.005, and P of 0.8. The film thickness of the magnetization oscillating layer is 1 nm. As can be seen from FIG. 5, 4 GHz oscillation is caused by applying a current at a current density J of approximately 0.7 MA/cm$^2$. Based on the above results, it is predicted that the reversal current is reduced by virtue of an assisting effect caused by the microwave magnetic field induced by providing a magnetization oscillating layer that has $M_s$ of 700 emu/cm$^3$, $\alpha$ of 0.005, P of 0.8, and t of 1 nm, and has the magnetization parallel to the film plane, with a nonmagnetic layer being interposed between the magnetization oscillating layer and the magnetic recording layer 6 having the magnetic characteristics expressed by $M_s$ of 700 emu/cm$^3$ and $K_u$ of 3.6 Merg/cm$^3$. Further, as the oscillating frequency is varied with the current flowing into the magnetization oscillating layer as shown in FIG. 5, wrong writing can be reduced at the time of information reading.

In a magnetic memory that uses the spin injection write technique, it is normally necessary to apply a smaller current than the write current even at the time of information reading, so as to measure the resistance. Since spin injection is performed onto the magnetic recording layer from the invariable magnetization layer 2 at this point, wrong writing might be performed. In this embodiment, however, wrong writing at the time of reading can be reduced by making the oscillating frequency generated by the magnetization oscillating layer 10 equal only to the frequency of the magnetic resonance of the magnetic recording layer with the current value used at the time of writing. For example, in a case where the magnetic recording layer 6 and the magnetization oscillating layer 10 are used, and the current density of the current flowing at the time of reading is 0.2 MA/cm², the oscillating frequency of the magnetization oscillating layer 10 becomes approximately 1 GHz, which is far from the magnetic resonance frequency of 4 GHz of the magnetic recording layer 6. As a result, the assisting effect of a microwave magnetic field is not caused, and wrong writing is not performed at the time of reading.

Figure 6:
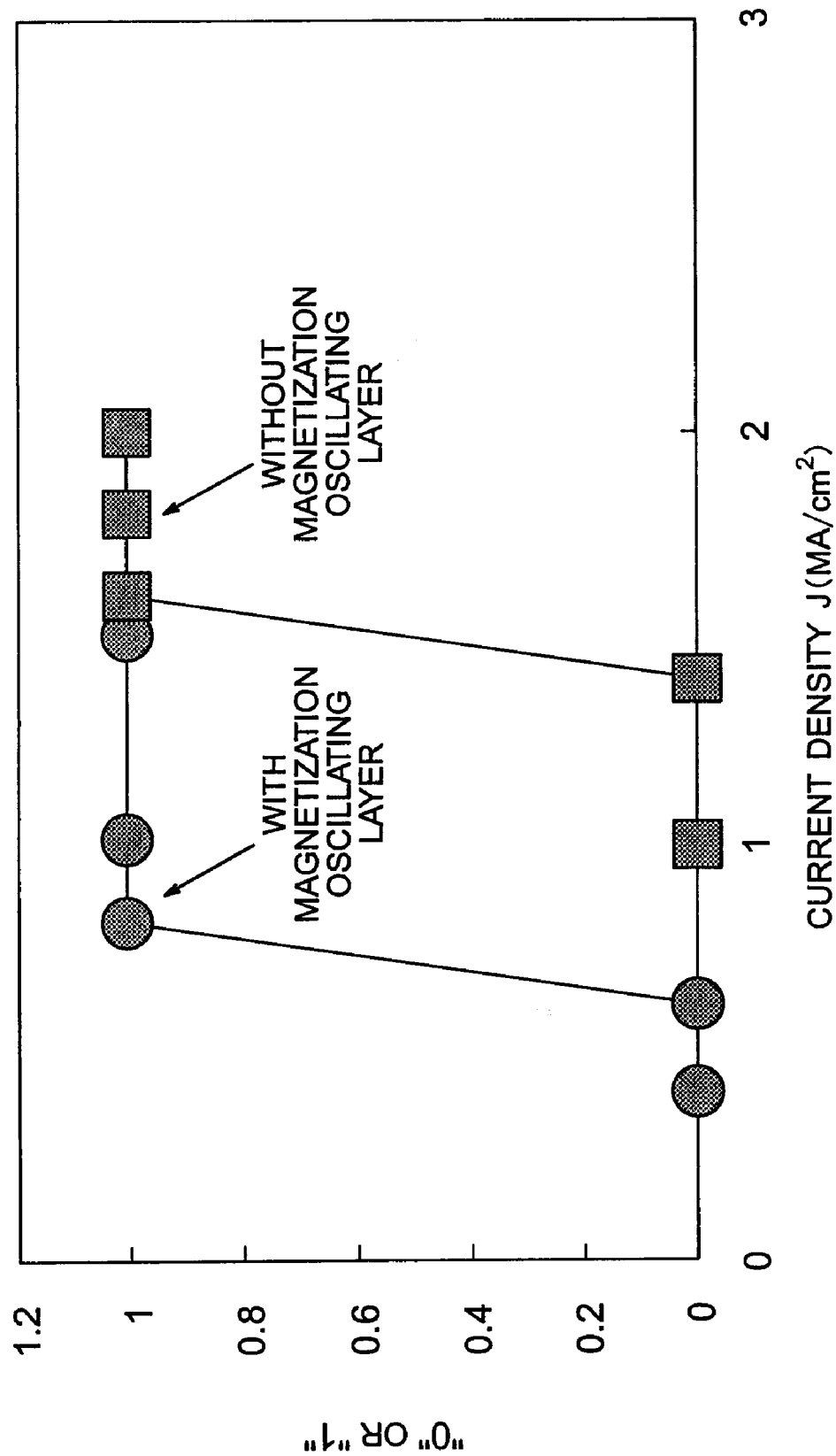
FIG. 6 shows the magnetization reversal characteristics observed in a case where a magnetization oscillating layer is provided, and the magnetization reversal characteristics observed in a case where a magnetization oscillating layer is not provided.
Figure 7:
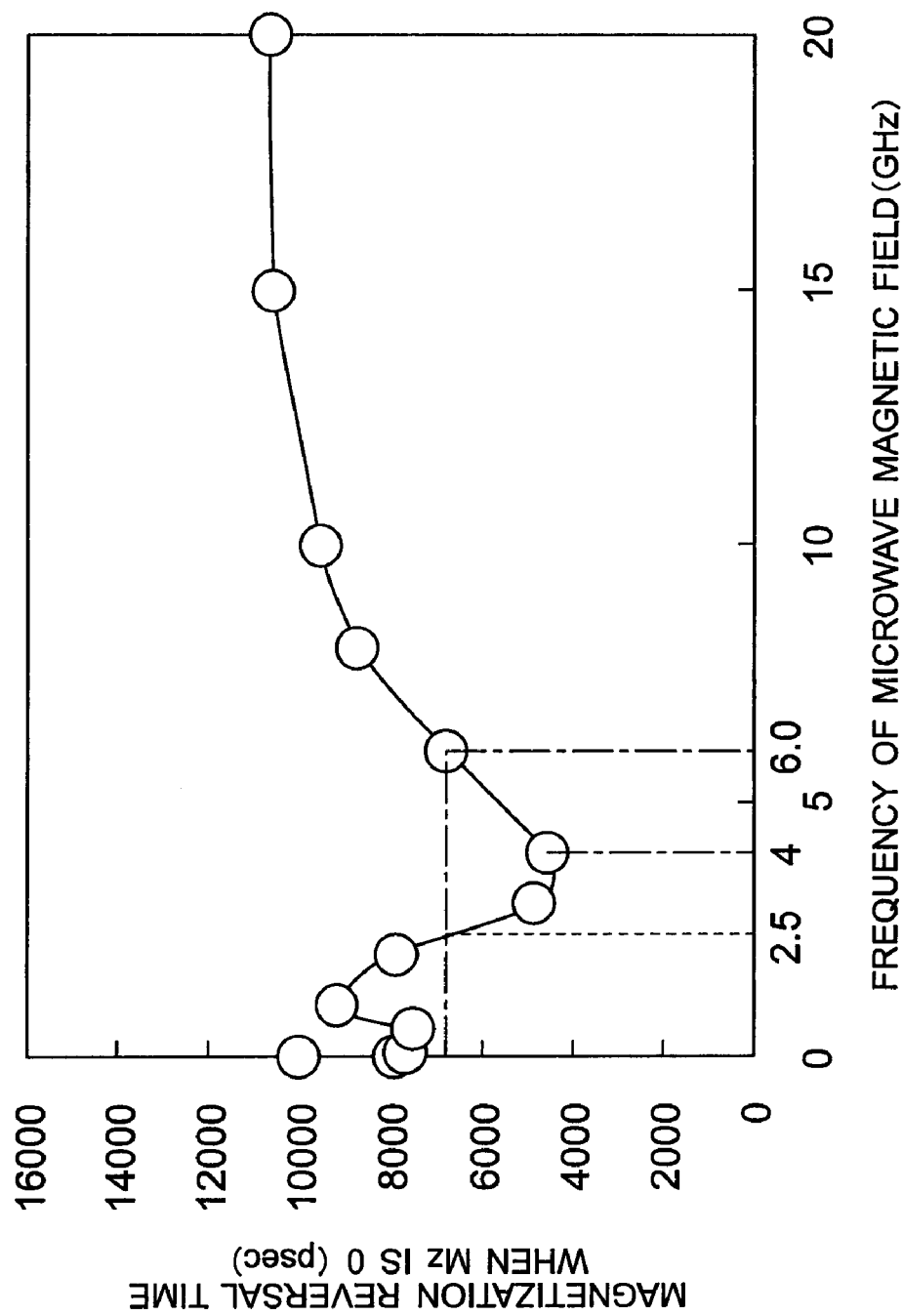
FIG. 7 shows the relationship between the microwave magnetic field and the magnetization reversal time.

Spin injection reversal current values are calculated through micromagnetic simulations in a case where a magnetization oscillating layer that has magnetization oscillating with spin injection from a magnetic recording layer and has a magnetization direction parallel to the film plane is located adjacent to the magnetic recording layer that has magnetic characteristics represented by $M_s$ of 700 emu/cm³ and $K_u$ of 3.6 Merg/cm³ and has a magnetization direction perpendicular to the film plane, or has an natural frequency of 4 GHz, and in a case where there is not a magnetization oscillating layer. FIG. 6 shows the results of a comparison between the reversal current values. In the simulations, the frequency of the rotating movement is adjusted to approximately 4 GHz in the film plane of the magnetization oscillating layer. Also, a distance adjustment is performed so that the magnetic field induced in the direction parallel to film plane is approximately 100 Oe. As can be seen from FIG. 6, the reversal current value required for spin injection writing can be almost halved by applying microwave of approximately 4 GHz to the magnetic recording layer from the magnetization oscillating layer. FIG. 7 shows the frequency dependence of the magnetization reversal time, which is obtained by adjusting the frequency of the rotating movement of the magnetization in the magnetization oscillating layer having a magnetization direction parallel to the film plane, and varying the frequency of the microwave magnetic field induced in the magnetic recording layer having a magnetization direction perpendicular to the film plane. The frequency dependence shown in FIG. 7 is obtained where the perpendicular-direction component Mz of the magnetization of the magnetic recording layer is "0". As is apparent from FIG. 7, the time necessary to cause a magnetization reversal is almost halved at the natural frequency of 4 GHz of the magnetic recording layer. As can be seen from FIG. 7, as long as the frequency of the microwave magnetic field is within the range of 2.5 GHz to 6.0 GHz, the magnetization reversal time becomes shorter, and there is an assisting effect of the microwave magnetic field. This means that, as long as the frequency of the microwave magnetic field is within the range of 62% (=2.5/4) to 150% (=6.0/4) with respect to the natural frequency of 4 GHz of the magnetic recording layer, there is an assisting effect.

In the magnetoresistance effect element in accordance with this embodiment, it is necessary to efficiently cause the magnetization oscillating layer 10 to have precession movement in the direction parallel to the film plane through spin injection from the magnetic recording layer 6. Therefore, the nonmagnetic spacer layer 8 interposed between the magnetic recording layer 6 and the magnetization oscillating layer 10 should be formed with a material that does not cause any change in the spin information of the magnetic recording layer 6. It is most preferable that the spacer layer 8 is formed with an alloy containing at least one element selected from the group of Cu, Au, and Ag, which are used as spacer layers in giant magnetoresistance elements. It is also possible to use an alloy such as Cu—Au. In a case where the spacer layer 8 is formed with an oxide containing one element selected from the group of Mg, Al, Ti, and Hf, which are used as tunnel barrier layers in tunnel magnetoresistance elements, a magnetization reversal in the magnetization oscillating layer is efficiently caused.

As described above, in accordance with this embodiment, the current value required to cause a magnetization reversal and the time required to cause a reversal can be made shorter than those in a case where conventional spin injection writing is performed. Accordingly, the write current can be made as small as possible, and high-speed writing can be performed. Furthermore, smaller-sized magnetoresistance effect elements can be formed, as the spin torque write technique is employed.

(Second Embodiment)

Figure 8:
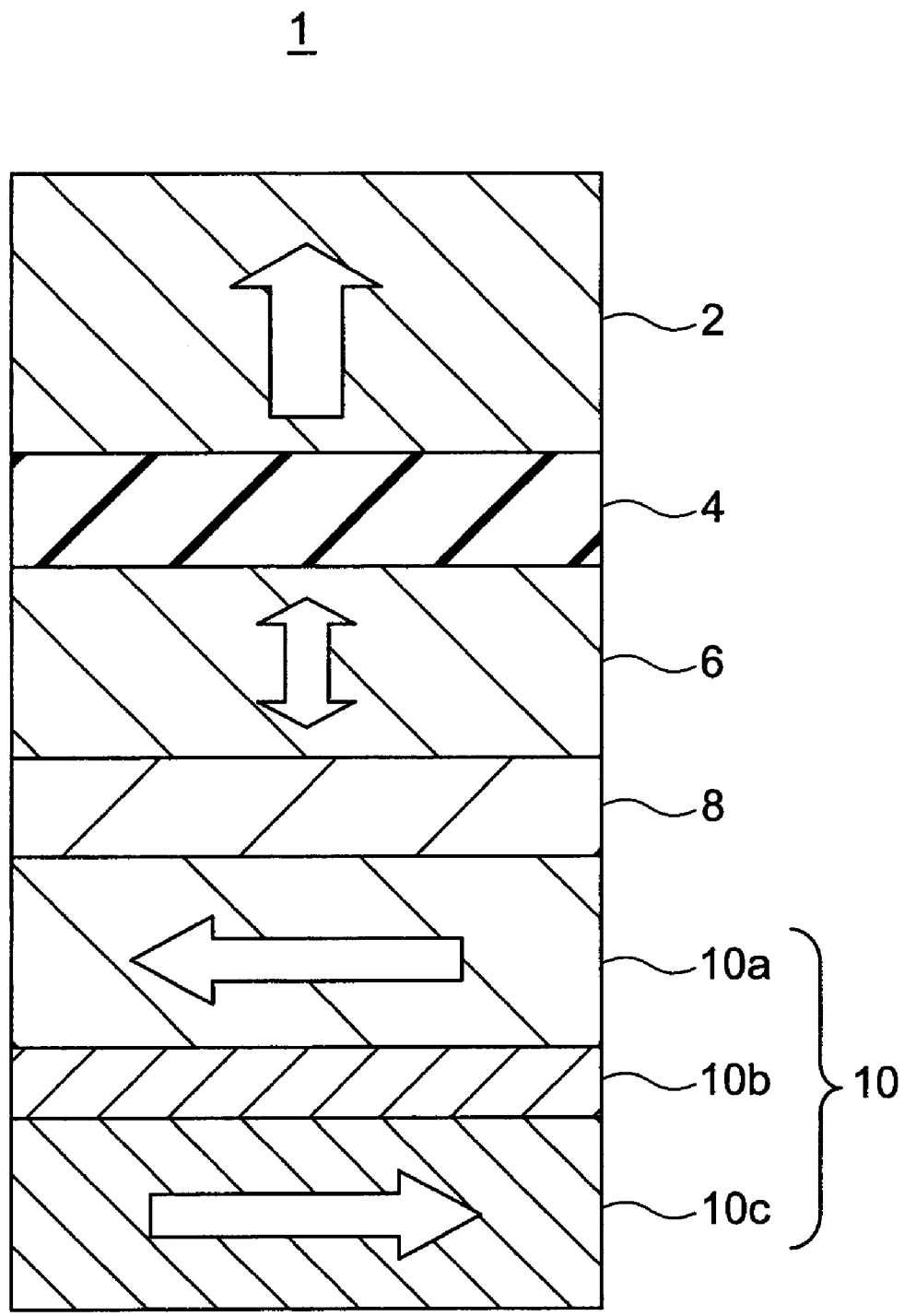
FIG. 8 is a cross-sectional view of a magnetoresistance effect element in accordance with a second embodiment of the present invention.

FIG. 8 shows a magnetoresistance effect element in accordance with a second embodiment of the present invention. The magnetoresistance effect element 1 of this embodiment is the same as the magnetoresistance effect element 1 of the first embodiment shown in FIG. 1, except that the magnetization oscillating layer 10 has a stacked structure of ferromagnetic layers 10a and 10c that are ferromagnetically coupled and have a nonmagnetic layer 10b interposed in between, instead of a single-layer ferromagnetic layer having a magnetization direction parallel to the film plane. The magnetization direction of each of the ferromagnetic layers 10a and 10c are parallel to the film plane.

If the magnetic material having magnetization parallel to the film plane is formed in a circular shape, a square shape, or a square-like shape having each corner rounded in a magnetization oscillating layer formed with a single-layer ferromagnetic film, a reflux domain structure might be formed. The reflux domain structure might hinder rotational movement of the magnetization parallel to the film plane. To counter this problem, a stacked film that includes the ferromagnetic layer 10a, the nonmagnetic layer 10b, and the ferromagnetic layer 10c is used as in this embodiment. With such a stacked structure, anisotropy for changing the magnetization parallel to the film plane 180 degrees in a relative manner can be applied so as to generate a stable microwave magnetic field that does not form a reflux domain.

Like the magnetoresistance effect element of the first embodiment, the magnetoresistance effect element of this embodiment can not only minimize the write current but also perform high-speed writing. Further, the magnetoresistance effect element of this embodiment can be made smaller, since the spin torque write technique is used.

(Third Embodiment)

Figure 9:
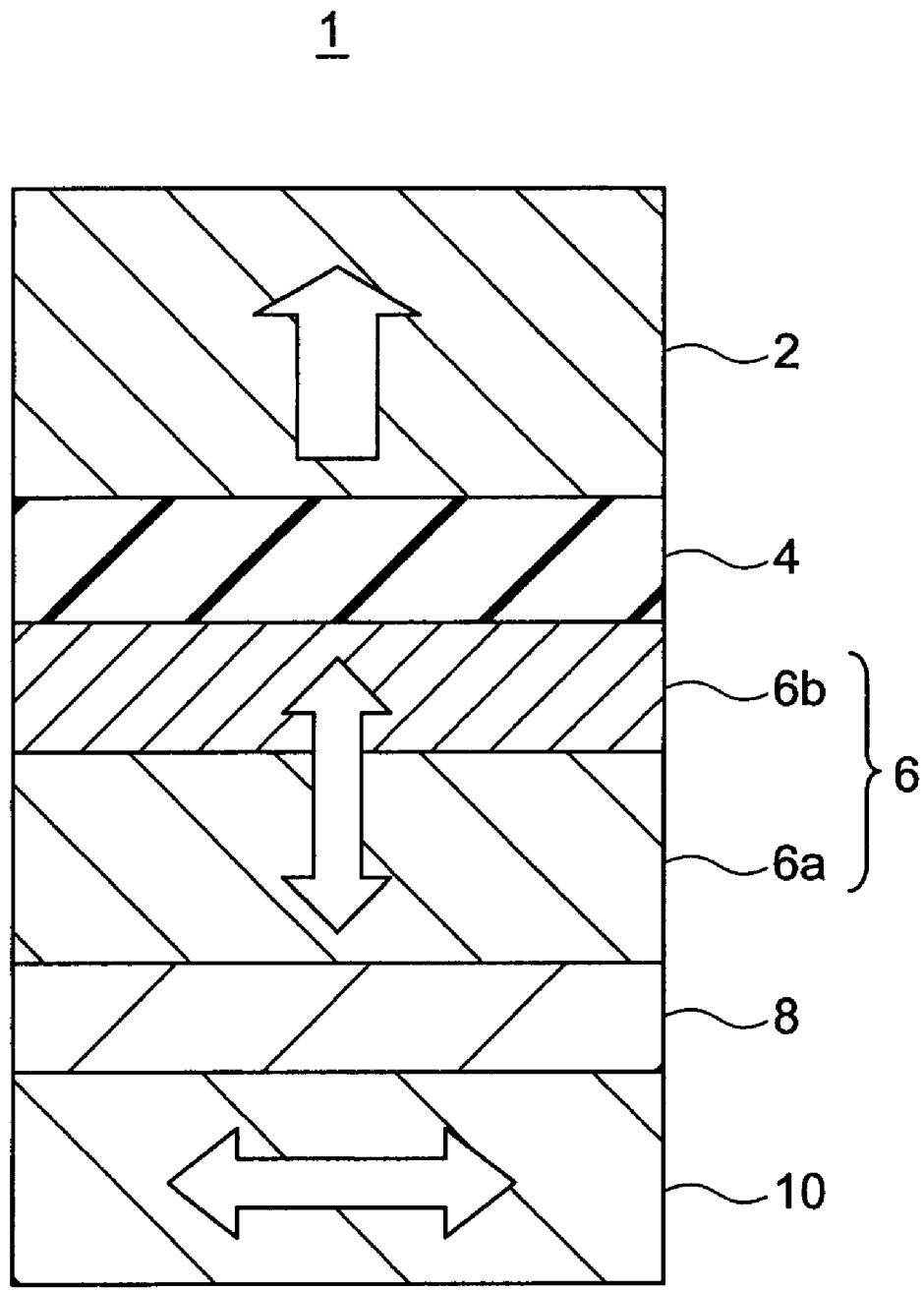
FIG. 9 is a cross-sectional view of a magnetoresistance effect element in accordance with a third embodiment of the present invention.

FIG. 9 shows a magnetoresistance effect element in accordance with a third embodiment of the present invention. The magnetoresistance effect element 1 of this embodiment differs from the magnetoresistance effect element 1 of the first embodiment shown in FIG. 1, in that the magnetic recording layer 6 is replaced with a stacked structure of an ordered alloy layer 6a or an alloy layer 6a and an alloy layer 6b. The ordered alloy layer 6a has a L10 crystalline structure containing at least one element selected from the group of Fe, Co, and Ni, and at least one element selected from the group of Pt and Pd. The alloy layer 6a is formed with an alloy having a hexagonal crystalline structure containing at least one element selected from the group of Fe, Co, and Ni, and at least one element selected from the group of Cr, Ta, Pt, and Pd, and has magnetic anisotropy in a direction substantially perpendicular to the film plane. The alloy layer 6b contains at least one element selected from the group of Fe, Co, Ni, and Mn. The materials for the ordered alloy having the L10 crystalline structure and the alloy having the hexagonal crystalline structure can be the same as those used in the first embodiment. Example materials for the alloy layer 6b include Co—Fe—B and a Fe alloy. Further, it is possible to add Mn, so as to adjust the saturation magnetization. Here, the alloy layers 6a and 6b are exchange-coupled to each other, so that the magnetization of either of the alloy layers is directed in a direction substantially perpendicular to the film plane. With such a stacked structure, a magnetic recording layer having sufficiently large perpendicular magnetic anisotropy can be formed.

Like the magnetoresistance effect element of the first embodiment, the magnetoresistance effect element of this embodiment can not only minimize the write current but also perform high-speed writing. Further, the magnetoresistance effect element of this embodiment can be made smaller, since the spin torque write technique is used.

(Fourth Embodiment)

Figure 10:
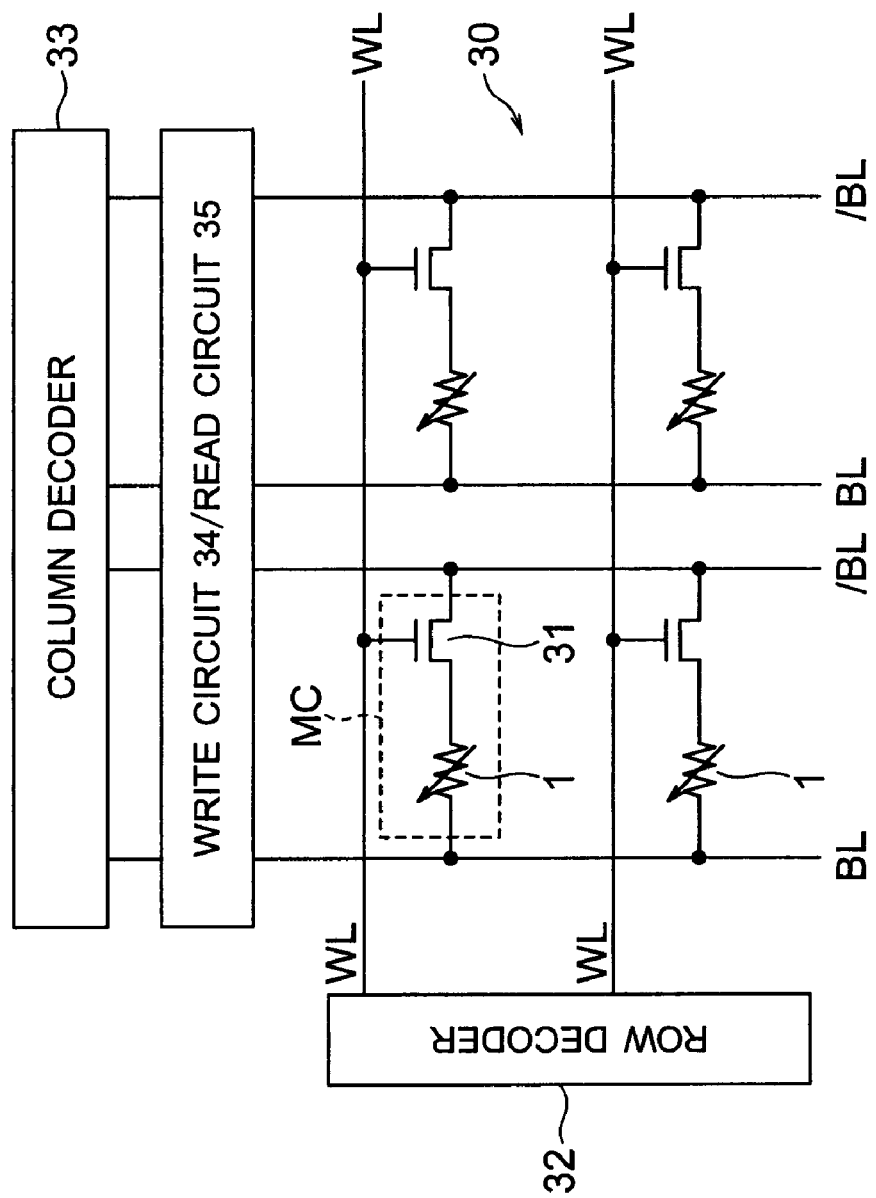
FIG. 10 is a circuit diagram of a magnetic random access memory in accordance with a fourth embodiment of the present invention.

FIG. 10 shows a magnetic random access memory (MRAM) in accordance with a fourth embodiment of the present invention. The MRAM of this embodiment includes a memory cell array 30 that has memory cells MC arranged in a matrix fashion. Each of the memory cells MC has a MTJ element 1 that is one of the magnetoresistance effect elements of the first to third embodiments.

In the memory cell array 30, bit line pairs BL and /BL are arranged in the extending direction of the columns. In the memory cell array 30, word lines WL are also arranged in the extending direction of the rows.

The memory cells MC are arranged at the cross portions between the bit lines BL and the word lines WL. Each of the memory cells MC includes the MTJ element 1 and a selective transistor 31. One end of the MTJ element is connected to the corresponding bit line BL. The other end of the MTJ element 1 is connected to the drain terminal of the selective transistor 31. The gate terminal of the selective transistor 31 is connected to the corresponding word line WL. The source terminal of the selective transistor 31 is connected to the corresponding bit line /BL.

A row decoder 32 is connected to the word lines WL. A write circuit 34 and a read circuit 35 are connected to the bit line pairs BL and /BL. A column decoder 33 is connected to the write circuit 34 and the read circuit 35. Each of the memory cells MC is to be selected through the row decoder 32 and the column decoder 33.

Data writing into the memory cells MC is performed in the following manner. First, to select the memory cell MC on which data writing is to be performed, the word line WL connected to the memory cell MC is activated. At this point, the selective transistor 31 is switched on.

A bidirectional write current Iw is then supplied to the MTJ element 1. More specifically, in a case where a write current Iw is supplied to the MTJ element 1 from the left-hand side toward the right-hand side, the write circuit 34 applies a positive potential to the bit line BL, and a ground potential to the bit line /BL. In a case where a write current Iw is supplied to the MTJ element 1 from the right-hand side toward the left-hand side, the write circuit 34 applies a positive potential to the bit line /BL, and a ground potential to the bit line BL. In this manner, data "0" or data "1" is written into the memory cell MC.

Data reading from the memory cells MC is performed in the following manner. First, one of the memory cells MC is selected. The read circuit 35 supplies a read current Ir flowing from the right-hand side toward the left-hand side to the MTJ element 1. Based on the read current Ir, the read circuit 35 detects the resistance value of the MTJ element 1. In this manner, the information stored in the MTJ element 1 can be read out.

As described above, in accordance with this embodiment, a MRAM can be formed with the MTJ elements 1 that are the magnetoresistance effect elements according to one of the first to third embodiments. With the use of the MTJ elements 1 that are the magnetoresistance effect elements according to one of the first to third embodiments, smaller-sized devices can be formed, and the write current can be minimized. Further, high-speed writing can be performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetoresistance effect element comprising:
a first ferromagnetic layer having invariable magnetization perpendicular to a film plane;
a second ferromagnetic layer having variable magnetization perpendicular to the film plane;
a first nonmagnetic layer interposed between the first ferromagnetic layer and the second ferromagnetic layer;
a third ferromagnetic layer provided on an opposite side of one of the first and second ferromagnetic layers from the first nonmagnetic layer, and having variable magnetization parallel to the film plane; and
a second nonmagnetic layer interposed between the third ferromagnetic layer and the one of the first and second ferromagnetic layers, and
spin-polarized electrons being injected into the second ferromagnetic layer by flowing a current in the direction perpendicular to the film planes between the third ferromagnetic layer and the other of the first and second ferromagnetic layers, precession movement being induced in the magnetization of the third ferromagnetic layer by injecting the spin-polarized electrons into the third ferromagnetic layer from the one of the first and second ferromagnetic layers through the second nonmagnetic layer, a rotating magnetic field of a frequency corresponding to the precession movement being applied to the second ferromagnetic layer.

2. The element according to claim 1, wherein the second nonmagnetic layer is an alloy containing at least one element selected from the group consisting of Cu, Au, and Ag.

3. The element according to claim 1, wherein the second nonmagnetic layer is an oxide containing at least one element selected from the group consisting of Mg, Al, Ti, and Hf.

4. The element according to claim 1, wherein the third ferromagnetic layer has a stacked structure that includes a third nonmagnetic layer and first and second ferromagnetic films, the third nonmagnetic layer being interposed between the first and second ferromagnetic films, the first and second ferromagnetic films each having a magnetization direction parallel to the film plane and being antiferromagnetically coupled to each other.

5. The element according to claim 1, wherein the second ferromagnetic layer is formed with a magnetic material having a L10 crystalline structure containing at least one element selected from the group consisting of Fe, Co, and Ni, and at least one element selected from the group consisting of Pt and Pd.

6. The element according to claim 1, wherein the second ferromagnetic layer is formed with a magnetic material having a hexagonal crystalline structure containing at least one element selected from the group consisting of Fe, Co, and Ni, and at least one element selected from the group consisting of Cr, Ta, Pt, and Pd.

7. The element according to claim 1, wherein the second ferromagnetic layer has a stacked structure that includes a magnetic material having a L10 crystalline structure containing at least one element selected from the group consisting of Fe, Co, and Ni, and at least one element selected from the group consisting of Pt and Pd, and an alloy containing at least one element selected from the group consisting of Fe, Co, Ni, and Mn.

8. The element according to claim 1, wherein the second ferromagnetic layer has a stacked structure that includes a magnetic material having a hexagonal crystalline structure containing at least one element selected from the group consisting of Fe, Co, and Ni, and at least one element selected from the group consisting of Cr, Ta, Pt, and Pd, and an alloy containing at least one element selected from the group consisting of Fe, Co, Ni, and Mn.

9. The element according to claim 1, wherein the frequency of the rotating magnetic field is within a predetermined range including the frequency of the magnetic resonance of the second ferromagnetic layer.

10. The effect element according to claim 1, wherein the spin-polarized electrons are generated by causing the current to flow into the first ferromagnetic layer.

11. A magnetic random access memory comprising:
the magnetoresistance effect element according to claim 1;
a first wire that is electrically connected to the first ferromagnetic layer; and
a second wire that is electrically connected to the third ferromagnetic layer.

12. The memory according to claim 11, further comprising:
a selective transistor, one of a source and a drain of which being electrically connected to one of the first and third ferromagnetic layers and the other of the source and the drain being electrically connected to first and second wires.

* * * * *